(12) United States Patent
Yumshtyk

(10) Patent No.: US 6,365,011 B1
(45) Date of Patent: Apr. 2, 2002

(54) DIFFUSION COATING APPLIED BY MAGNETRON SPUTTERING

(75) Inventor: Gennady Yumshtyk, Edmonton (CA)

(73) Assignee: Cametoid Limited, Whitby (CA)

( * ) Notice: Subject to any disclaimer, the term of this patent is extended or adjusted under 35 U.S.C. 154(b) by 0 days.

(21) Appl. No.: 09/397,075

(22) Filed: Sep. 16, 1999

Related U.S. Application Data

(62) Division of application No. 09/257,012, filed on Feb. 25, 1999, now Pat. No. 6,193,853.

(51) Int. Cl.[7] ............ C23C 14/34; C23C 14/35
(52) U.S. Cl. ............ 204/192.15; 204/192.12; 204/298.12; 204/298.16; 204/298.26
(58) Field of Search ............ 204/192.12, 192.15, 204/298.16, 298.26, 298.12

(56) References Cited

U.S. PATENT DOCUMENTS

| | | | | |
|---|---|---|---|---|
| 4,041,353 A | * | 8/1977 | Penfold et al. ............ 315/267 |
| 4,478,703 A | * | 10/1984 | Edamura et al. ............ 204/298 |
| 4,536,640 A | * | 8/1985 | Vukanovic ............ 204/298.41 |
| 4,842,704 A | * | 6/1989 | Collins et al. ......... 204/298.21 |
| 5,026,466 A | * | 6/1991 | Wesemeyer et al. ... 204/298.41 |
| 5,102,697 A | * | 4/1992 | Grunke et al. ............ 427/229 |
| 5,228,963 A | * | 7/1993 | Rose ............ 204/298.21 |

FOREIGN PATENT DOCUMENTS

| | | | |
|---|---|---|---|
| GB | 2 109 822 A | * | 6/1983 |
| JP | 63-93857 | * | 4/1988 |

\* cited by examiner

Primary Examiner—Stephen Kalafut
Assistant Examiner—Julian A. Mercado
(74) Attorney, Agent, or Firm—Lynn C. Schumacher; Hill & Schumacher

(57) ABSTRACT

A method of applying diffusion coatings by magnetron sputtering includes the use of a solenoid coil which produces an alternating magnetic field to inductively heat the article to be coated. The coating may preferably be a multi-layer or multi-component diffusion coating which may include a diffusion barrier and/or a thermal barrier.

14 Claims, 4 Drawing Sheets

DIFFUSION COATING APPLIED BY MAGNETRON SPUTTERING

CROSS-REFERENCE TO RELATED APPLICATIONS

This application is a continuation-in-part of U.S. Pat. application Ser. No. 09/257,012 filed Feb. 25, 1999, now issued to U.S. Pat. Ser. No. 6,193,853 B1 issued on Feb. 27, 2001, the contents of which are incorporated herein by reference.

FIELD OF THE INVENTION

The present invention relates to a method of applying diffusion coatings by magnetron sputtering and in particular, to a method of applying multi-layer or multi-component diffusion coatings. The invention also relates to multi-layer diffusion-coated products.

BACKGROUND OF THE INVENTION

A. Magnetron Sputtering

Magnetron sputtering is a well-known process for applying thin coatings onto objects. Sputtering is implemented by creating an electrical plasma over the surface of an target emitter material in a low-pressure gas atmosphere. Gas ions from the plasma are accelerated by electrical fields to bombard and thereby eject atoms from the surface of the emitter. These atoms travel through the gas environment until they impact the surface of the object to be coated, where they bond to the object, creating the coating layer.

A standard method of improving the efficiency of sputtering has been to use magnetic fields to confine electrons to the glow region in the vicinity of the emitter surface. The addition of such magnetic fields increases the rate of ionization which in turn increases the ion energy and the number of ions in the plasma. The increased ion energy and number of ions increases the overall sputtering rate.

Cylindrical magnetron sputtering devices are known which utilize elongated emitters and solenoid coils which produce flux lines parallel to the axis of the emitter. A significant drawback to such cylindrical sputtering devices is that they suffer from undesirable end effects. In a cylindrical magnetron, the direction of the electron drift velocity vector causes the electrons to orbit around the longitudinal axis of the emitter. However, the electrons tend to leak out or escape their orbits near each end of the emitter, resulting in lower ionization intensities and therefore lower sputtering rates at each end of the emitter. As a result, the portions of the object to be coated in the vicinity of the ends of the emitter may receive little or no coating.

Another drawback to cylindrical magnetrons is that in order to uniformly coat long objects such as pipes, a corresponding long vacuum chamber. emitter and solenoid coil must be provided, adding to the complexity and expense of the apparatus.

B. Diffusion Coatings

Diffusion coatings are coatings in which the coating material has diffused into the substrate such that atoms of the coating material and atoms of the substrate are intermixed. If the surface of the object is subjected to an elevated temperatures sputtered atoms will penetrate or diffuse through the surface of the object and intermix with the metallurgy of the object. It is well-known to create diffusion coatings using pack cementation techniques. As defined in ASM Metals Handbook, Volume 5, : "Diffusion coatings are deposited either by heating the components to be treated in contact with the powder coating material in an inert atmosphere (solid-state diffusion) or by heating them in an atmosphere of a volatile compound of the coating material (out of contact gas phase deposition or chemical vapour deposition).

Diffusion coatings are known for their resistance to undesirable effects such as corrosion, oxidation, carburisation, erosion or hydrogen embrittlement, especially at elevated operating temperatures.

In Canadian Patent Application No. 2.175,439, filed Apr. 30, 1996, a diffusion coating, is disclosed which is referred to as a surface alloy. In this patent application, surface alloying may be achieved by a heat treatment subsequent to deposition of the coating. Alternatively, it is taught that surface alloying may be achieved during deposition by heating the substrate component to a temperature above 600° C. In either case, it is clear that an external heat source is required to heat the component because no other method of heating the component is disclosed.

Creating a diffusion coating using magnetron sputtering requires that the object be externally heated. It is possible to heat the object to be coated by placing the object in a furnace to achieve the necessary temperatures which allows the creation of a diffusion coating. However, this usually requires placing the entire sputtering apparatus in the furnace which is cumbersome procedure.

C. Multi-Layer or Multi-Component Diffusion Coatings

It is often desirable to produce diffusion coatings with more than one component or layer of material, where each component or layer confers a certain performance characteristic to the coating. Aluminum-silicon codiffusion using pack cementation deposition techniques are well-known. However, simultaneous diffusion of other coating materials such as chromium, silicon and titanium have not been entirely successful despite being the subject of extensive study.

Although it is known to produce multi-layer diffusion coatings by sequential sputter depositing of individual layers, there has been no prior art disclosure of a method of depositing a multi-layer coating, in a single sputtering step.

Therefore, there is a need in the art for apparatuses and methods suitable for producing diffusion coatings using magnetic field enhanced magnetron sputtering. It would be further desirable to produce multi-component or multi-layer diffusion coatings with different properties through its cross-section.

SUMMARY OF THE INVENTION

In general terms, the invention comprises a method for applying a diffusion coating onto a workpiece using magnetic field enhanced magnetron sputtering, where the magnetic field is created by a solenoid coil which inductively heats the workpiece to a level where the coating diffuses into the workpiece. In a preferred embodiment, the workpiece is a tubular product such as a pipe or fitting which is made from stainless steel alloy.

Therefore, in one aspect of the invention, the invention comprises a method of diffusion coating a metal substrate by magnetic field enhanced magnetron sputtering wherein the substrate is inductively heated during coating deposition by a solenoid coil in a configuration of a coiled tubular conductor connected to a high current/high frequency AC power supply which produces the magnetic field. The substrate may typically be a metal pipe, tube or fitting and the solenoid coil may be external to and coaxial with the metal pipe, tube or fitting. Preferably, the AC power supply operates above a frequency of about 500 Hertz and more preferably in the range of about 1 kHz to about 2 kHz. The skin temperature of the substrate should reach at least about 350° C. and should preferably be in the range of about 900° C. to about 1200° C.

The present invention also comprises a method of applying multi-component or multi-layer diffusion coatings. Therefore, in another aspect of the present invention, a method of diffusion coating a metal tube comprises the steps of:

(a) providing an emitter comprising at least two substantially concentric layers of differing composition;

(b) sputtering the emitter onto the metal tube such that the outermost layer of the emitter first diffuses into the surface of the metal tube and subsequent layers of the emitter diffuse into the coating surface thereby created; and (c) subjecting the metal tube to an elevated temperature during the sputtering step or in a subsequent heat treating step,.

Preferably, the outermost layer of the emitter comprises elements of relatively low solubility and the inner layer of the emitter comprises elements of relatively high solubility. The different layers of the emitter result in a layered diffusion coating on the metal tube wherein each layer confers different performance characteristics onto the metal tube.

In another aspect of the invention, the invention comprises a diffusion coated product which comprises a base alloy and a diffusion coating exterior to the base alloy wherein said diffusion coating comprises a plurality of coating layers each containing a mixture of a plurality of coating elements, wherein each coating layer has a composition different from the other coating layers. The coating elements may preferably be chosen from a group comprised of aluminium, silicon, titanium, chromium, zirconium, tungsten, vanadium, molybdenum, niobium, hafnium, tantalum and cobalt.

The elements may be chosen and applied such that the plurality of layers confer different properties to the diffusion coating, said properties chosen from the group consisting of: wear resistance, oxidation resistance, carburisation resistance, corrosion resistance or high temperature resistance.

Preferably, the diffusion coating comprises silicon, titanium and aluminum. The coating may comprise of three or more coating layers. Preferably, an outer layer is enriched in titanium, an intermediate layer is enriched in aluminum and an inner layer is enriched in silicon. Additionally a coating layer may be designed to act as a diffusion barrier or a thermal barrier.

BRIEF DESCRIPTION OF THE DRAWINGS

The invention will now be described by way of exemplary embodiments with reference to the accompanying simplified, diagrammatic, not-to-scale drawings. In the drawings.

DETAILED DESCRIPTION OF THE INVENTION

Figure 1:
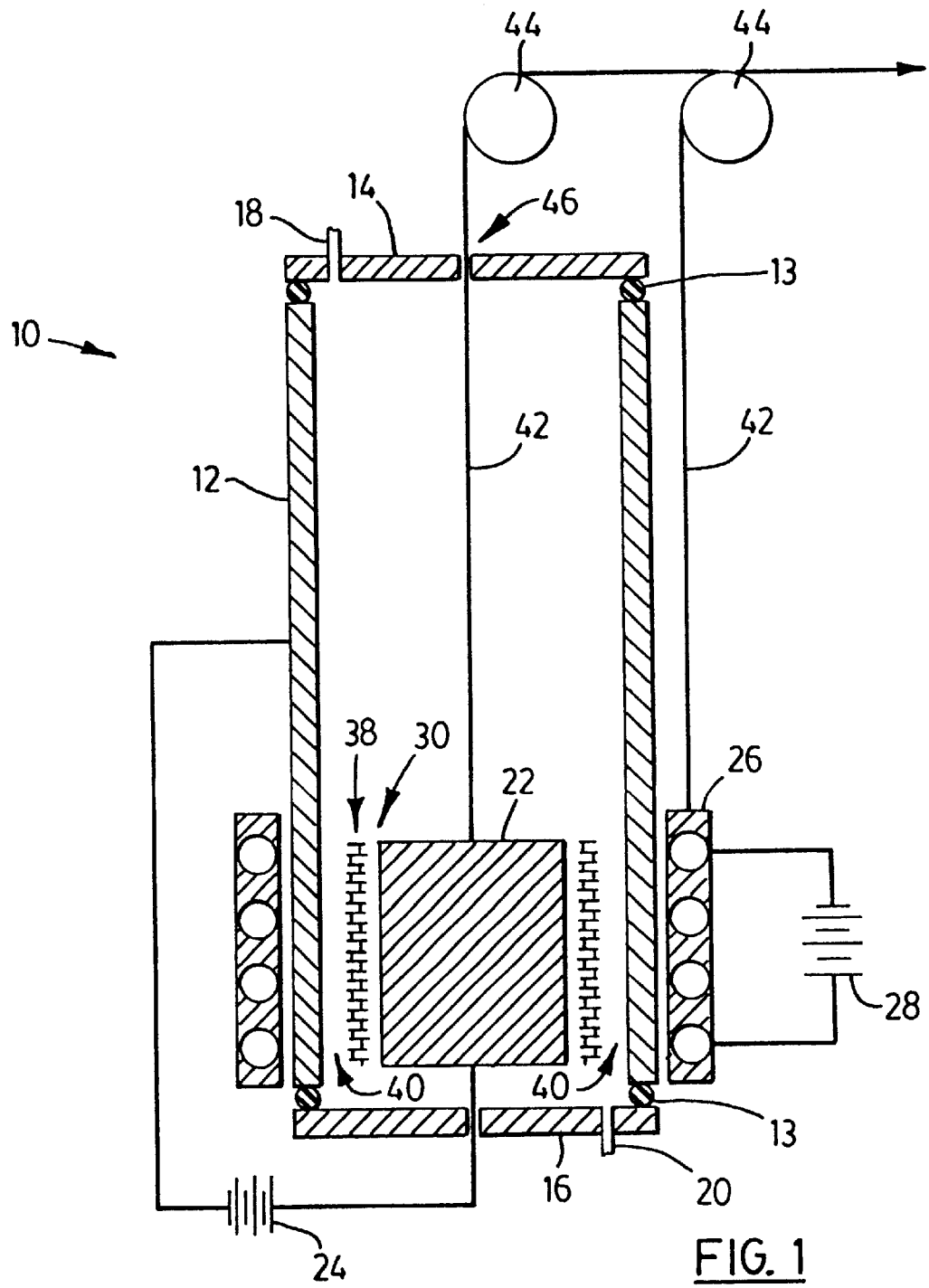
FIG. 1 is a cross-sectional depiction of a preferred embodiment of the invention wherein the inside surface of a workpieces is coated.

The present invention includes methods of producing a diffusion coating on a metal pipe, tube or fitting (hereinafter referred to as the "worklpieece" or "substrate") by magnetic field enhanced magnetron sputtering. A suitable apparatus for carrying out such methods is disclosed in co-pending U.S. application Ser. No. 09/257,012 the contents of which are incorporated herein.

As used herein, the term "diffusion coatings" refers to a coating layer on a substrate in which the coating elements and the substrate elements have interdiffused. The coating layer will contain both the deposited elements and substrate elements. As used herein, the term "diffusion barrier" refers to a interdiffused layer which is enriched in an element or compound which tends to inhibit the further diffusion of other coating elements or substrate elements. The diffusion barrier is typically enriched with silicon or chromium.

In accordance with the present invention, well-known methods of magnetic sputtering are used to create a diffusion coating by heating, the substrate using the magnetic field created by a solenoid coil. The magnetic field also enhances the sputtering efficiency of the process as is well-known in the industry.

Inductive heating of a metal substrate is caused when a magnetic field created by a solenoid coil connected to a high current, high frequency AC power source is applied to the substrate. Such a magnetic field itself alternates as a result of the alternating current and induces microcurrents within the substrate which generate heat. The frequency of the AC power source should be between about 500 Hz and 10 KHz and preferably in the range of 1 KHz to about 2 KHz. In an exemplary power supply suitable to be implemented in this invention, the output is 700 A, with a frequency range of 1 KHz to 2 KHz and a voltage of between 20 to 50 V.

The frequency at which the power supply operates depends upon the nature of the workpiece. The higher the frequency, the shallower the inductive heating effect on the workpiece. For example, it is known that current penetration of copper at 3 KHz is approximately 0.06 inches, while the penetration at 10 KHz is approximately 0.03 inches. In the preferred embodiment, a solenoid coil is used to generate the alternating magnetic field because temperature uniformity is directly affected by the uniformity of the magnetic field. A solenoid coil generates a very uniform magnetic field and is therefore particularly suitable. As well, the present invention is preferably applied to tubular products such as pipe, which fits coaxially with a solenoid coil.

In magnetron sputtering apparatus of the present invention the workpiece (12) acts as an anode while a cathode, referred to herein as the emitter (22), comprises the material desired to be coated on the workpiece (12). The emitter (22) may be a commodity grade tube or solid cylinder of the coating material. Suitable coating materials are well known for many different applications such as corrosion protection or erosion or physical wear protection. Specific examples of such coating materials will be discussed further herein. The emitter (22) may comprise a core which is itself coated with a deposit of the coating material by thermal spraying or electroplating or other well-known methods.

A high voltage, preferably DC, power source (24) is placed between the emitter (22) and the workpiece (12) as is shown in FIG. 1. When switched on, the power source creates a high potential difference between the workpiece (12) and the emitter (22) which enables the creation of a plasma field (38) around the emitter. The emitter (22) should be water-cooled as is well known in the art.

Figure 2:
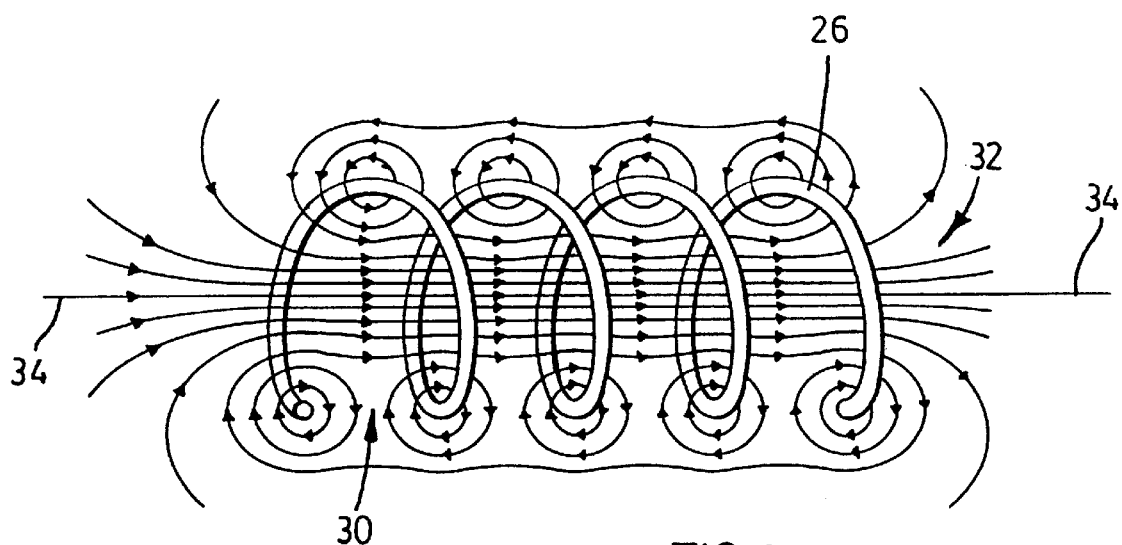
FIG. 2 is a schematic depiction of the field lines generated by the solenoid coil of the present invention.

The solenoid coil (26) is wound around the workpiece (12) and comprises copper tubing in the preferred embodiment. Other highly conductive heat resistant materials may be used in the place of copper tubing. The solenoid (26) is connected to a suitable inductive power supply (28). As a result, the solenoid (26) creates a magnetic field (30) with magnetic field lines (32) parallel to the centroidal axis (34) of the solenoid as is schematically depicted in FIG. 2.

In operation, the sputtering chamber (12) is evacuated and an insert gas, preferably argon, is fed through the inlet pipe (18) into the sputtering chamber (36). The high voltage power supply (24) is connected to the cathode emitter (22) and to the anode workpiece (12). The high voltage creates a glow discharge and plasma in the argon gas in the vicinity of the emitter (22) surface, forming a plasma sheath (38) around the emitter. Essentially, electrons are discharged at high energies from the cathode emitter (22) into the argon gas to create the plasma in which the argon atoms are stripped of electrons and ionized. These highly excited ionized argon atoms from the plasma accelerate towards the emitter (22) and bombard the emitter (22) to sputter or erode atoms from the emitter surface. The sputtered atoms are also quite highly excited, migrate to the surface of the workpiece (12), where they plate themselves onto the surface.

The magnetic field (30) is created within the sputtering chamber (12, 50) by means of the solenoid (26) which is coiled around the workpiece (12) as shown in the Figures. The magnetic field lines (32) are substantially axial and parallel to the cylindrical emitter (22) as is schematically depicted in FIG. 3. The highest concentration of magnetic field lines is in the centre of the solenoid (26) and magnetic field strength is constant over the longitudinal cross-section of the solenoid (26).

In the preferred embodiment, the solenoid coil (26) is fashioned from a material of high conductivity such as copper tubing. The magnetic field strength is given by the following expression which is derived from Ampere's law:

$$\beta = \mu_o In$$

where $\beta$ = field strength in Gauss $\mu_o$ = permeability constant

I = current n = number of turns per unit length

As is obvious, higher currents will result in higher magnetic field strengths which will result in more efficient sputtering. As well, the more tightly packed the coil (high number of turns per unit length), the higher the field strength. Further, the higher the magnetic field strength, the greater the inductive heating effect on the workpiece. A minimum field strength of about 300 Gauss is generally required for magnetron sputtering. In the preferred embodiment, a field strength of about 700 Gauss is preferred.

The magnetic field (30) generated by the solenoid (26) of the present invention causes electrons to orbit around the emitter (22), along the longitudinal axis of the emitter, parallel to the magnetic field lines (32) shown in FIG. 3. Such electrons tend to leak out or escape their orbits near each end of the emitter (22), resulting in lower sputtering rates at each end of the emitter (22), if the emitter is approximately the same length as the solenoid, or longer than the solenoid. This disadvantage is overcome in the preferred embodiment by moving the emitter (22) and solenoid coil (26) relative to the workpiece (12) to provide a more even coating distribution along the length of the workpiece (12).

In one embodiment of the invention, synchronized movement of the emitter (22) and the solenoid (26) is accomplished by means of a cable and electric motor configuration. As is illustrated in FIG. 1, the emitter (22) and solenoid (26) are each attached by means of a cable (42) and sheaves (44) to an electric drive (not shown) such that they are moved in unison. The first cable (42) passes through the top end plate (14), using conventional sealed fittings (46), and attaches to the emitter (22). The second cable (42) attaches to the solenoid (26). The cables (42) are made from or coated with non-conductive materials such as well-known polymers or ceramics.

The magnetic field (30) greatly enhances the sputtering efficiency of the present invention. Although sputtering will take place along the entire length of the emitter (22) where a gas plasma field (38) has been created, if a magnetic field (30) of sufficient strength is present, sputtering efficiency increases 100-fold or more. As a result, the area of overlap between the magnetic field (30) and the plasma field (38) is referred to herein as the "coating zone" (40). This zone is where sputtering occurs at a rate sufficient to create a coating of significant thickness. In the preferred embodiment shown in FIG. 1, the plasma field (38) and the magnetic field (30) closely overlap because the solenoid (26) and the emitter (22) are approximately equal in length and are positioned opposite each other. The coating zone (40) thereby created is moved along the length of the workpiece (12) by moving both the solenoid and the emitter at the same time.

The surfaces of substrates to be coated in accordance with the present invention should be prepared using well known and conventional surface preparation and cleaning techniques. For example, the surface may be degreased, undergo oxide removal and drying treatment.

It is known that the sputtered molecules emitted by the emitter (22) arrive at the workpiece (12) surface with sufficient energy that surface impurities may be driven off and the sputtered atom may penetrate into the lattice of workpiece substrate to generate a diffusion-type coating. Because the surface of the workpiece (12) is at an elevated temperature, it is in a somewhat fluid state and the sputtered molecules are significantly more efficient in penetrating the lattice such that the sputtered atoms diffuse into the surface layer of the workpiece (12).

One problem that may occur when heating portions of an elongated cylindrical workpiece (12) is that the workpiece may warp as a result of uneven thermal expansion. The potential problem is alleviated in a preferred embodiment of the present invention by orienting the workpiece vertically and further alleviated by tensioning the workpiece by fixing the top end plate (14) and applying a tensioning force to the workpiece (12) or the bottom end plate (16) as is shown in FIG. 6. The tensioning force counteracts any tendency for the workpiece to warp and may be applied, for example, by providing, a support flange (50) at one end of the workpiece and another flange (54) at the end, to which a tensioning force (P) is applied. The force may be applied as simply as attaching a weight (not shown) to the flange (54).

The amount of tension applied to the workpiece (12) may tie determined by the size of the workpiece (wall thickness, inside and outside diameters), its material composition and the temperature being applied. The amount of tension may be varied by a simple tensioning mechanism by increasing or decreasing the weight which is applied to the workpiece. Alternatively, a hydraulic tensioning system may be adapted to provide the necessary force using a hydraulic cylinder and ram (not shown). In either instance, the tensioning load applied may be precisely controlled so that the workpiece can freely expand and contract, returning to its original shape and length at the end of the coating process.

When the coating is sputtered onto the substrate and the substrate is at an elevated temperature, the coating atoms "diffuse" into the substrate molecular lattice creating a diffusion type coating. It is well known to use titanium, aluminum and silicon as diffusion coating elements onto high-temperature stainless steel alloys. As well, most Group IV, V and VI elements are suitable coating elements. Yttrium, cerium and manganese are also known coating elements. Many elements have good solubility with iron so that they are compatible to form diffusion coatings on ferrous based alloys. These elements include gold, copper, chromium, titanium and zinc amongst many others that are well-known in the art. Other elements such as silver, cadmium, lithium, magnesium and lead have been demonstrated to be incompatible to form diffusion coatings on ferrous alloys.

Where the substrate is a nickel based alloy, different elements may have different solubilities, and hence have different tendencies to form protective coatings and diffusion barriers in a nickel-rich alloy. For example, it is known that the following elements are ranked in order of their solubility in nickel-rich NiAl: Mo, Nb, W, Ta, Cr, Ti,, Pt, Co, and Fe. These elements are in decreasing order of their tendency to form diffusion barriers.

The choice of coating elements depends on the composition of the substrate to be coated and its intended use. One skilled in the art of diffusion coatings will be aware of, or will be able to determine through minimal experimentation, the appropriate elements in order to obtain a diffusion coating having the desired properties.

In a preferred embodiment, the methods and apparatus of the present invention may be implemented to produce multi-layered or multi-component diffusion-type coatings. Each layer or component may have different physical, chemical or metallurgical properties to confer different properties on the coating. For example, oxidation resistance, corrosion protection or carburisation resistance are often desirable properties. A multi-component coating may be produced by sputtering with an emitter comprised of a mixture of different elements. A multi-layer coating may be produced by sequential sputtering with different emitters, however, it is preferred to produce such a coating by sputtering with an emitter which itself has layers of different composition.

The coating layers may be engineered to include a diffusion barrier which serves to inhibit further migration of the coating elements when the workpiece is subjected to elevated temperatures in use. The composition of effective diffusion barriers are well known and include various oxides or carbides of a coating element.

The coating layer may also be engineered to include a thermal barrier. The following compounds, amongst others, may be included in such a thermal barrier, as is well known in the art: zirconium oxide, aluminum oxide, molybdenum silicide, silicon carbide and hafnaium oxide.

The multiple components or layers diffuse into the substrate and into each other to form a blended coating which is advantageous. Not only do the coating, components diffuse into the lattice of the substrate, but components of the substrate diffuse outward into the coating.

The following example is provided to illustrate the claimed invention and is not to be construed as a limitation thereof.

EXAMPLE 1

Figure 3A:
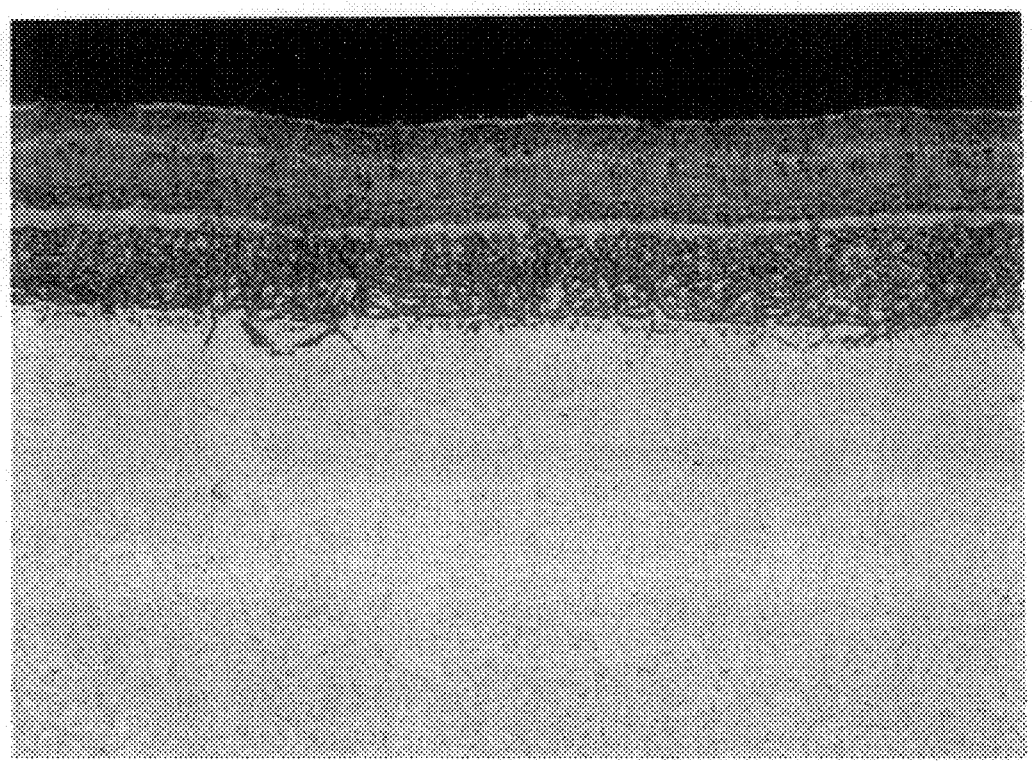
FIG. 3A is an optional micrograph (Vilella's reagent microetech) of a coating of the present invention (200x)
Figure 3B:
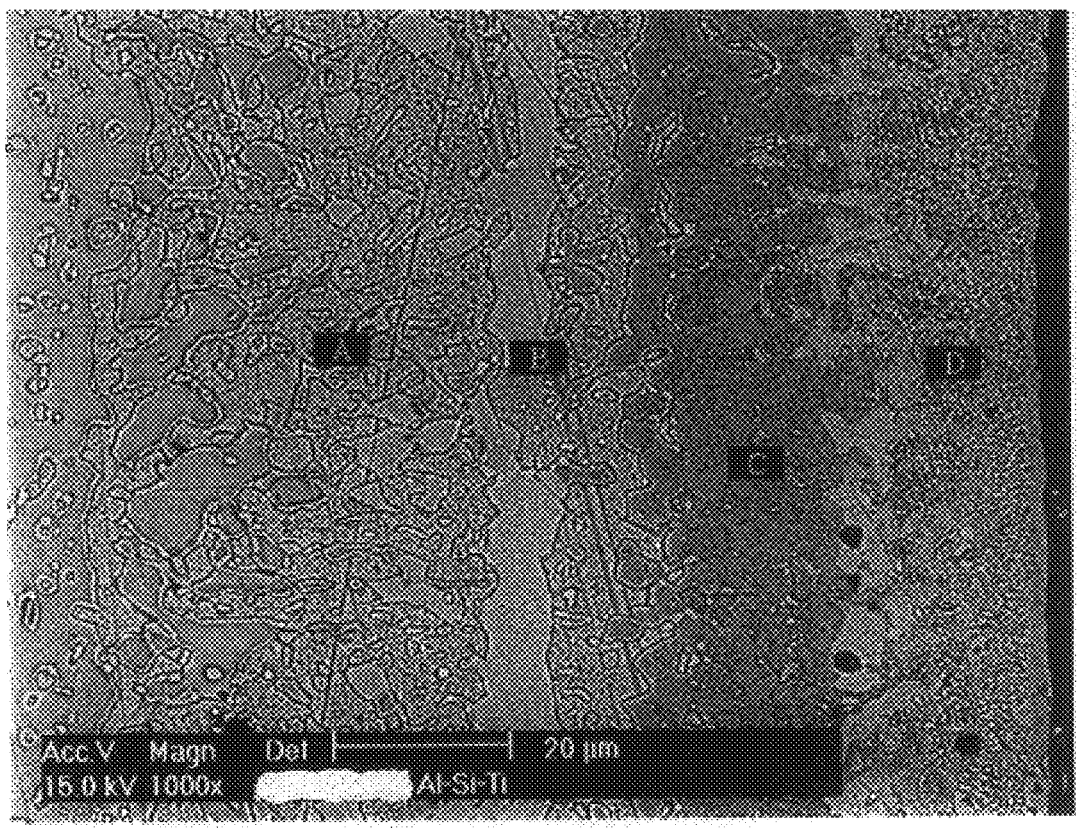
FIG. 3B is a scanning electron microscope miicrograph (backscattered electrons) of a cross-section of a coating of the present invention (1000x).

FIG. 3A is a scanning electron micrograph, magnified 1000X, of a multi-layered coating having a thickness of approximately 110 to 125 $\mu$m, produced in accordance with the present invention. The diffusion coating (100) is shown is being made up of a very thin (2.5 $\mu$m) superficial surface layer and four relatively distinct zones which are identified as (A), (B), (C) and (D) in order from the substrate (102) outwards. Zone A is approximately 53 $\mu$m thick, zone B is approximately 8 $\mu$m thick, zone C is approximately 30 $\mu$m thick and zone D is approximately 20 $\mu$m thick. The substrate (102) in this example is a well-known stainless steel alloy (Incoloy 800).

The multi-layer coating was produced by using an emitter having two layers. The first or outer layer was comprised of a mixture of aluminium and silicon in approximately equal proportions. The second or inner layer was comprised of a mixture of titanium, aluminium and silicon in approximately equal proportions. When such an emitter is used, the outer layer (Al and Si) and then the inner layer (Ti, Al, Si) are sequentially emitted and diffused into the substrate. Of these elements, Al has the highest solubility in the substrate alloy, followed by Ti and Si, which has the lowest solubility.

The resulting coating has very high hardness as shown in the following Table:

TABLE 1

| Depth in mils (Zone) | Knoop Microhardness |
| --- | --- |
| 1 (zone D) | 711 |
| 2 (zone C) | 759 |
| 3 (zone A) | 1059 |
| 4 (zone A) | 510 |
| 5 (substrate) | 241 |
| 6 (substrate) | 179 |
| 7 (substrate) | 180 |

The weight percent composition of the surface layer and each zone was analyzed by energy dispersive spectrometric analysis with the following results:

| Zone | % Al | % Si | % Ti | % Cr | % Fe | % Ni |
| --- | --- | --- | --- | --- | --- | --- |
| Surface | 2.3 | 14.8 | 17.1 | 7.3 | 28.7 | 30.0 |
| D | 6.5 | 9.8 | 7.9 | 10.3 | 31.5 | 34.1 |
| C | 19.2 | 3.5 | 1.3 | 2.8 | 17.2 | 56.0 |
| B | 1.7 | 10.1 | 1.7 | 24.3 | 43.1 | 19.1 |
| A | 3.2 | 7.3 | 0.5 | 24.6 | 44.2 | 20.2 |

The diffusive nature of the coating is demonstrated with these results. The chromium, iron and nickel components of the stainless steel substrate have been displaced outward and is present in each zone, including the surface layer. Some aluminium has penetrated to zone A although zone C exhibits the largest concentration of aluminium. Silicon has diffused throughout the coating but has its largest concentration in the surface layer and in zone B. Titanium has also diffused into each zone of the coating but the largest concentrations of titanium are found in the outermost zone and the superficial surface layer.

Zone B in this example serves as a diffusion barrier because of its enrichment with silicon, which has the lowest solubility in the substrate alloy out of the three coating elements. It is of note that Al has failed to diffuse significantly beyond zone C, despite having the highest solubility.

The relative proportions of each coating element in the coating layer, or in zones within the coating layer, may be controlled by one skilled in the art by controlling the composition and layering of the emitter and other variables in the sputtering process. In this manner, the coating layer may be engineered for specific applications by engineering the coating layer to have specific desirable properties.

As will be apparent to those skilled in the art, various modifications, adaptations and variations of the foregoing specific disclosure can be made without departing from the teachings of the present invention.

The embodiments of the invention in which an exclusive property or privilege is claimed are defined as follows:

1. A method of diffusion coating a metal substrate by magnetic field enhanced magnetron sputtering wherein the metal substrate is inductively heated during coating deposition by a solenoid coil in a configuration of a coiled tubular conductor connected to a high current/high frequency AC power supply which produces a magnetic field.

2. The method of claim 1 wherein the metal substrate is a metal pipe, tube or fitting and the solenoid coil is external to and coaxial with the metal pipe, tube or fitting.

3. The method of claim 1 wherein the AC power supply operates above a frequency of about 500 Hertz.

4. The method of claim 3 wherein the AC power supply operates at a frequency between about 1 kHz and 2 kHz.

5. The method of claim 1 wherein a skin temperature of the metal substrate which is inductively heated is above about 350° C.

6. The method of claim 4 wherein a skin temperature of the metal substrate which is the inductively heated is between about 900° C. and about 1200° C.

7. A method of diffusion coating a metal tube comprising the steps of:

(a) providing an emitter comprising at least two substantially concentric layers of constituents of differing composition including an outermost layer and at least one inner layer;

(b) sputtering the emitter onto a surface of the metal tube such that the constituents of the outermost layer of the emitter first diffuse into the surface of the metal tube producing a coating and the constituents of the at least one inner layer of the emitter diffuse into the coating; and (c) subjecting the metal tube to an elevated temperature during the sputtering step or in a subsequent heat treating step.

8. The method of claim 7 wherein the outermost layer of the emitter comprises components of relatively low solubility and the at least one inner layer of the emitter comprises components of relatively high solubility.

9. The method of claim 7 wherein said at least two substantially concentric layers of constituents of differing composition of the emitter result in a diffusion coating of a plurality of layers on the metal tube wherein each of said plurality of layers of said diffusion coating confers different performance characteristics onto the metal tube.

10. The method of claim 9 wherein at least one of said plurality of layers of said diffusion coating is a diffusion barrier.

11. The method of claim 10 wherein the diffusion barrier is enriched with a metallic oxide or carbide.

12. The method of claim 9 wherein at least one of said plurality of layers of said diffusion coating is a thermal barrier.

13. The method of claim 12 wherein the thermal barrier is enriched with a compound selected from a group consisting of zirconium oxide, aluminum oxide, molybdenum silicide, silicon carbide and hafnium oxide.

14. The method of claim 9 wherein said different performance characteristics are selected from a group of performance characteristics consisting of wear resistance, oxidation resistance, carburisation resistance, corrosion resistance and high temperature resistance.

* * * * *